United States Patent [19]

Ooki et al.

[11] Patent Number: 5,360,155
[45] Date of Patent: Nov. 1, 1994

[54] WIRE BONDING APPARATUS

[75] Inventors: Toyokazu Ooki, Hino; Kuniyuki Takahashi, Musashimurayama, both of Japan

[73] Assignee: Kabushiki Kaisha Shinkawa, Tokyo, Japan

[21] Appl. No.: 89,704

[22] Filed: Jul. 9, 1993

[51] Int. Cl.⁵ .................................. H01L 21/607
[52] U.S. Cl. .................... 228/1.1; 228/4.5; 228/8
[58] Field of Search ............ 228/1.1, 4.5, 8, 102, 228/110.1, 111, 180.5

[56] References Cited
U.S. PATENT DOCUMENTS 3,384,283  5/1968  Mims ............................ 228/1.1
4,696,425  9/1987  Landes .......................... 228/1.1
5,275,324  1/1994  Yamazaki et al. .............. 228/4.5

Primary Examiner—Samuel M. Heinrich
Attorney, Agent, or Firm—Koda and Androlia

[57] ABSTRACT

An ultrasonic bonding apparatus including a piezoelectric element which transmit a vibration via the electric strain or magnetic strain effect to a capillary which is mounted to a non-resonant bonding arm, a microcomputer which outputs frequency data and amplitude data and an open-loop control circuit which includes a memory in which output waveform data is stored, a programmable frequency generator which varies the frequency according to the frequency data from the microcomputer and outputs a memory address switching signal, a first D/A converter which determines the amplitude in accordance with the amplitude data from the microcomputer, and a second D/A converter which applies output voltage or current to the piezoelectric element based upon the output waveform data at an address stored in the memory and selected by the address switching signal which is sent from the programmable frequency generator and upon the amplitude determined by the first D/A converter.

2 Claims, 3 Drawing Sheets

WIRE BONDING APPARATUS

DETAILED DESCRIPTION OF THE INVENTION

1. Field of the Invention

The present invention relates to a wire bonding apparatus.

2. Prior Art

A wire bonding apparatus used in manufacturing semiconductor devices, for example, is generally structured in the following manner:

A bonding head is mounted to an XY table that moves in the X and Y directions, and a bonding arm is attached to this bonding head either directly or via a lifter arm so as to move up and down or pivot. A capillary is attached to the tip of the bonding arm, and a bonding wire is passed through the capillary. A vibrator for transmitting a vibration to the bonding arm is attached to the root end of the bonding arm. When the bonding wire or a ball formed at the tip of the wire is bonded to a workpiece, the vibrator is caused to vibrate via a PLL (phase-locked loop) oscillator circuit so that bonding is performed with the vibrating bonding arm that is maintained at a resonance frequency. The PLL oscillator circuit constantly tracks the frequency so that there is no deviation from the resonance frequency.

In this prior art, the vibration of the bonding arm depends on the resonance frequency. Accordingly, during bonding, the bonding arm tends to resonate with a workpiece such as lead frames, semiconductor chips, etc., causing cracks, etc. in the workpiece. Thus, a deleterious effect is observed in the bonding. In addition, the resonance frequency can shift due to fluctuations in the load during bonding; as a result, it is necessary to install a frequency tracking circuit in order to obtain appropriate resonance frequency.

SUMMARY OF THE INVENTION

The object of the present invention is to provide a wire bonding apparatus that can supply stable vibrational energy to a bonding arm and can change the frequency and amplitude for individual bonding operations, thus accomplishing even bonding.

The structure of the wire bonding apparatus of the present invention includes: a piezoelectric element which transmits a vibration by means of electric strain or magnetic strain effect to a capillary of the bonding arm; a microcomputer which outputs frequency data and amplitude data that determines the amplitude; and a control circuit which determines output waveform data and amplitude for the oscillation of the capillary in accordance with the frequency data and amplitude data supplied from the microcomputer and applies an output voltage and output current to the piezoelectric element.

When the wire or a ball formed at the tip of the wire protruding from the tip of the capillary is pressed against the workpiece by the capillary for bonding, a voltage is applied to the piezoelectric element at a certain frequency. When a voltage is thus applied to the piezoelectric element, the piezoelectric element undergoes repeated expansion and contraction as a result of the electric strain or magnetic strain effect. The vibration generated by this expansion and contraction of the piezoelectric element is transmitted to the capillary via the bonding arm, and with this vibrational energy transmitted to the capillary, the wire is bonded to the workpiece. The frequency data and amplitude data suitable to a workpiece are inputted in the control circuit from the microcomputer, and the control circuit determines the output waveform data and the amplitude in accordance with the inputted data from the microcomputer and then applies an output voltage or current to the piezoelectric

BRIEF DESCRIPTION OF THE DRAWINGS

FIG. 5: An example of output in which

FIG. 6: another example of output in which

DETAILED DESCRIPTION OF THE INVENTION

Below, one embodiment of the present invention will be described with reference to the accompanying drawings.

Figure 2:
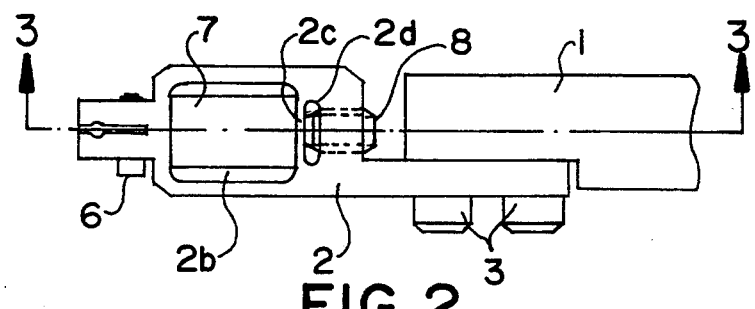
FIG. 2: A top view of a bonding arm according to one embodiment of the wire bonding apparatus of the present invention.
Figure 3:
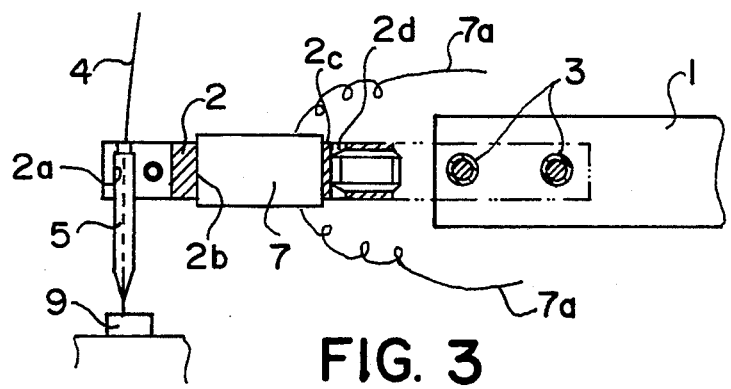
FIG. 3: A cross section taken along the line A—A in FIG. 2.

As shown in FIGS. 2 and 3, one end of a bonding arm 2 is fastened to a lifter arm 1 by means of bolts 3, and a capillary 5 through which a wire 4 is passed is mounted to the tip end of the bonding arm 2 by a bolt 6. The capillary installation hole 2a formed in the bonding arm 2 is a stepped hole, so that the height of the capillary 5 is adjustable. The bonding arm 2 has a piezoelectric element attachment hole 2b which is roughly a square shape, and a laminated piezoelectric actuator (hereafter called "piezoelectric element") 7 is fastened in this piezoelectric element attachment hole 2b by a bonding agent. The piezoelectric element 7 is installed so that its strain direction is perpendicular to the central axial line of the capillary 5. In addition, the bonding arm 2 has a hole 2d formed on the opposite side of the capillary 5 of the capillary installation hole 2a relative to the attachment hole 2b, so that a thin wall part 2c is formed. A bolt 8 is screwed in so that it presses against the thin wall part 2c. By turning the bolt 8, a preliminary pressure is applied to the piezoelectric element 7 via the thin wall part 2c. This preliminary pressure is adjusted to a value of approximately two to eight kg by means of, for example, a torque wrench. Once the preliminary pressure has been applied, the bolt 8 is fastened in place by a bonding agent. The reference numeral 9 is a workpiece.

Figure 4:
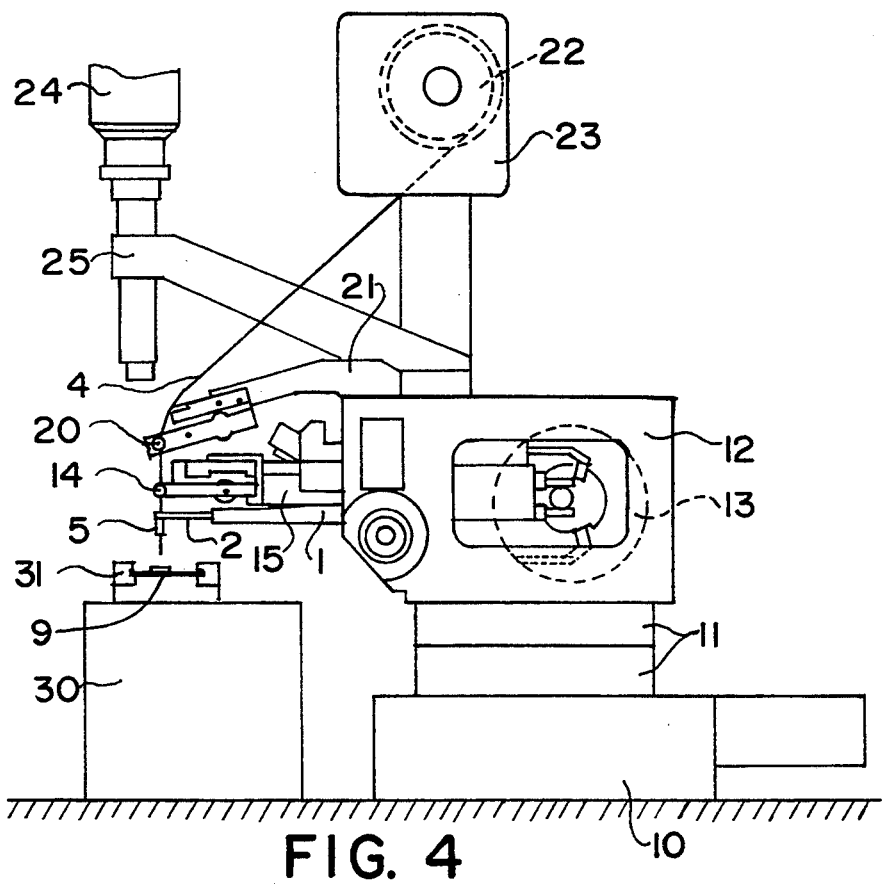
FIG. 4: A side view of the wire bonding apparatus according to the present invention.

FIG. 4 illustrates a wire bonding apparatus to which the present invention is applied. An XY table 11 which is driven in the X and Y directions is mounted on a supporting base 10, and a bonding head 12 is fastened to the upper surface of this XY table 11. The lifter arm 1 is installed on the bonding head 12 so that the lifter arm 1 can move up and down. The lifter arm 1 is raised and lowered by a motor 13. A clamper support 15 which holds a wire cutting clamper 14 is fastened to the lifter arm 1. Furthermore, the bonding head 12 includes a clamper supporter 21 which holds a wire holding clamper 20 that clamps the wire 4 lightly, a spool supporter 23 which holds a spool 22 around which the wire 4 is wound, and a camera supporter 25 which holds a camera 24 that detects the workpiece 9. From the spool 22, the wire 4 is reeled off to pass through the wire holding clamper 20, the wire cutting clamper 14 and then brought into the capillary 5. The reference numerals 30 and 31 respectively indicate a feeder which feeds the workpieces 9 and guide rails which guide the workpieces 9.

Figure 1:
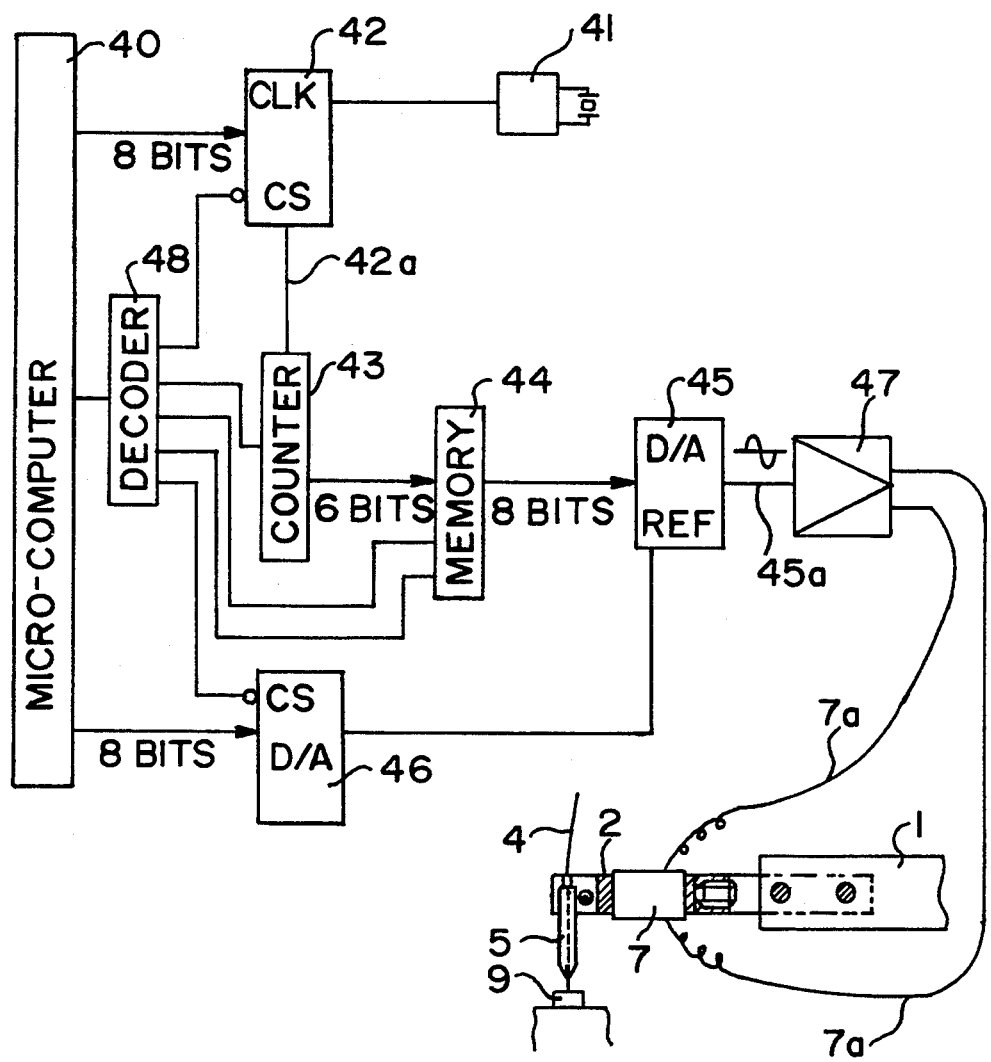
FIG. 1: A block diagram of a control circuit device according to one embodiment of the wire bonding apparatus of the present invention.

FIG. 1 illustrates an open-loop control circuit for controlling the piezoelectric element 7. In this figure, the reference numeral 40 is a microcomputer which controls the wire bonding apparatus, 41 is a clock circuit which generates a standard frequency (clock signal), and 42 is a programmable frequency generator which changes (divides) the standard or reference frequency of the clock circuit 41 in accordance with a frequency data supplied from the microcomputer 40. The control circuit further includes a counter 43 that determines the address of output waveform data stored in a memory 44 which is a PROM, etc. The counter 43 operates in accordance with the output of the programmable frequency generator 42. Furthermore, the control circuit includes a second D/A converter 45 which controls the output voltage of the output waveform data inputted from the memory 44, a first D/A converter 46 which determines the amplitude of the output voltage of the second D/A converter 45, and an amplifier 47 which amplifies the output voltage from the second D/A converter 45 and drives the piezoelectric element 7. The decoder 48 of the control circuit evaluates the address data from the microcomputer 40 and makes a selection out of the programmable frequency generator 42, counter 43, memory element 44 and first D/A converter 46.

The operation of this embodiment will be described

The description of the bonding operation will be given first with reference to FIGS. 2 through 4. The bonding operation is performed by a conventional well known method. In particular, the capillary 5 is moved vertically and in the X and Y directions by raising and lowering the lifter arm 1 via the motor 13 and also by moving the XY table 1 in the X and Y directions. Accordingly, a detailed description of such a movement will be omitted. When the capillary 5 contacts the workpiece 9 (more accurately, when a ball formed at the tip of the wire 4 comes into contact with the workpiece 9 at a first bonding point, or when the wire 4 contacts the workpiece 9 at a second bonding point) and the wire 4 is bonded to the workpiece 9, a voltage is applied to the wiring 7a of the piezoelectric element 7 at a certain frequency, When a voltage is thus applied to the piezoelectric element 7 at a certain frequency, the piezoelectric element 7 undergoes repeated expansion and contraction due to the electric strain or magnetic strain effect. The vibration generated by this expansion and contraction of the piezoelectric element 7 is transmitted to the capillary 5 via the bonding arm 2, and the wire 4 is joined, that is, bonded, to the workpiece 9 by the vibrational energy transmitted to the capillary 5.

Since the apparatus operates based upon the electric strain or magnetic strain effect of the piezoelectric element 7, there is no need to set the bonding arm 2 to be the same length as the resonance wavelength. Accordingly, the apparatus can be smaller and lighter. Moreover, while the conventional vibrators weigh approximately 30 g, the piezoelectric element 7 used in the present invention weighs approximately 3 g, which is approximately 1/10 of the conventional vibrator. Thus, the size and weight of the apparatus can be smaller too. Furthermore, in the conventional bonding methods that use resonance, fluctuations in the load during the bonding can cause shifts in the resonance frequency. Thus, the resonance frequency must be tracked by a frequency tracking circuit. The present embodiment, however, is a non-resonance system; accordingly, a frequency tracking circuit is unnecessary, and a stable vibrational energy can be supplied.

Figure 5A:
FIG. 5(a) shows the output of a programmable frequency generator and FIG. 5(b) shows the output of a second D/A converter which is sent to a piezoelectric element.
Figure 5B:
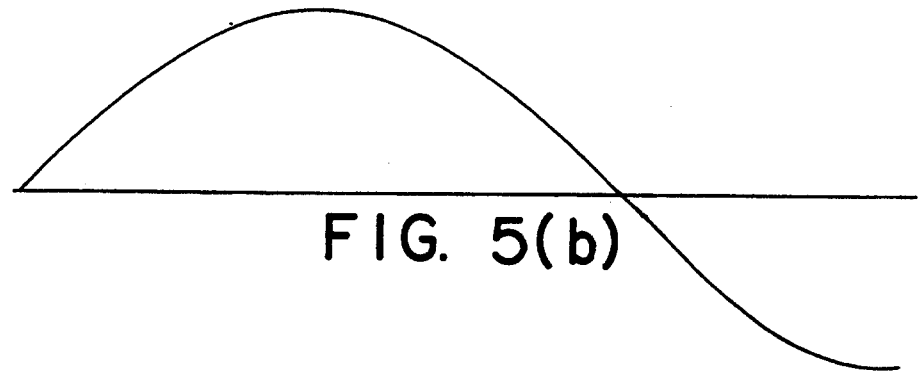
Figure 6A:
FIG. 6(a) shows the output of a programmable frequency generator and FIG. 6(b) shows the output of a second D/A converter which is sent to a piezoelectric element.
Figure 6B:
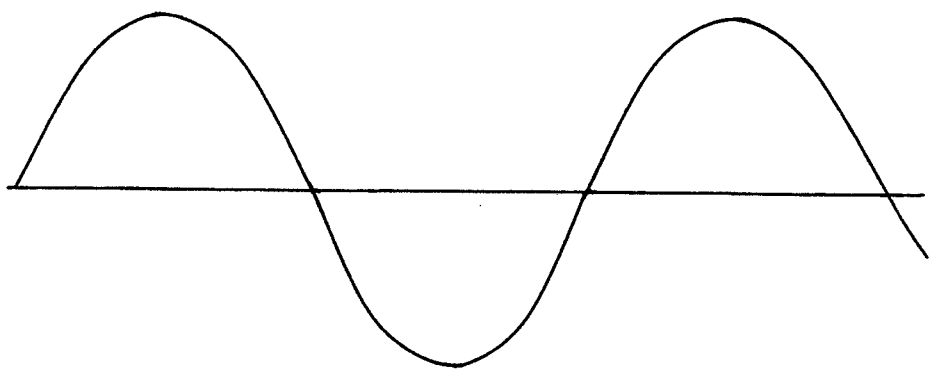

Next, the application of voltage to the piezoelectric element 7 will be described with reference to FIGS. 1, 5 and 6. When a frequency data suitable for a (particular) workpiece 9 is sent to the programmable frequency generator 42 from the microcomputer 40, the programmable frequency generator 42 changes or divides the reference frequency of the clock circuit 41 in accordance with the frequency data and sends out an output 42a. This output 42a varies depending upon the frequency data from the microcomputer 40. For example, the output 42a may have the shape shown in FIG. 5(a) or 6(a). This output 42a acts as an address switching signal for the output waveform data stored in the memory 44. The address switching signal outputted from the programmable frequency generator 42 is inputted in the counter 43, and the counter 43 is actuated so that the address of the output waveform data recorded in the memory 44 is designated. The output waveform data at the address in the memory 44 designated by the counter 43 is inputted in the second D/A converter 45. In addition, a signal which determines the amplitude is sent separately to the first D/A converter 46 from the microcomputer 40, and the amplitude of the output voltage of the second D/A converter 45 is determined by the first D/A converter 46. The second D/A converter 45 determines a voltage with a given frequency and waveform which is inputted in the amplifier 47 in accordance with the output waveform data that is inputted from the memory 44 and the amplitude-determining signal that is inputted from the first D/A converter 46. For example, an output 45a of the second D/A converter 45 has the shape shown in FIG. 5(b) or 6(b). The voltage output from the second D/A converter 45 is amplified by the amplifier 47 so as to drive the piezoelectric element 7. As to the output of the amplifier 47, a current driving system may be used.

As seen from above, frequency data and amplitude data for a workpiece to be bonded are inputted into the control circuit from the microcomputer 40, and the control circuit determines the output waveform data and amplitude in accordance with those data from the microcomputer; as a result, an appropriate output voltage or current is applied to the piezoelectric element 7. Accordingly, energy can be supplied in a stable fashion during bonding by shifting the frequency from the resonance region of the workpiece. Furthermore, since the frequency and the output power supplied to the piezoelectric element 7 is changeable during bonding, ideal bonding can be accomplished.

In the present invention, the bonding apparatus of the present invention includes: a piezoelectric element which transmits a vibration, via the electric strain or magnetic strain effect, to a capillary of a bonding arm, a microcomputer which outputs frequency data and amplitude data that determines the amplitude; and a control circuit which determines the output waveform data and amplitude in accordance with the frequency data and amplitude data sent from the microcomputer so as to apply an output voltage or current to the piezoelectric element. Accordingly, it is possible to supply stable vibrational energy. Also, the frequency and amplitude can be changed in each bonding operation, so that stable bonding is accomplished.

We claim:

1. An ultrasonic wire bonding apparatus comprising; a bonding arm having a capillary through which a wire is passed and being pivotally movable up and down, a piezoelectric element that transmits a vibration via electric strain or magnetic strain effect to said capillary of said bonding arm; a microcomputer that outputs frequency data and amplitude data; and an open-loop control circuit that determines output waveform data and amplitude in accordance with said frequency data and amplitude data supplied from said microcomputer and applies an output voltage or current to said piezoelectric element and wherein said bonding arm is not resonant at an ultrasonic frequency set by said frequency data.

2. A wire bonding apparatus according to claim 1 characterized in that said control circuit comprises: a memory in which output waveform data is stored; a programmable frequency generator which changes a frequency in accordance with said frequency data supplied from said microcomputer and outputs an address switching signal for said memory; a first D/A converter which determines an amplitude in accordance with said amplitude data supplied from said microcomputer; and a second D/A converter which applies an output voltage or current to said piezoelectric element in accordance with an output waveform data stored in an address of said memory and designated by said address switching signal supplied from said programmable frequency generator and with an amplitude determined by said first D/A converter.

* * * * *